United States Patent
Howard

(10) Patent No.: US 10,520,542 B2
(45) Date of Patent: Dec. 31, 2019

(54) SYSTEM FOR FAULT DETERMINATION FOR ELECTRONIC CIRCUITS

(71) Applicant: Alan Howard, Everett, WA (US)

(72) Inventor: Alan Howard, Everett, WA (US)

(73) Assignee: Huntron, Inc., Mill Creek, WA (US)

( * ) Notice: Subject to any disclaimer, the term of this patent is extended or adjusted under 35 U.S.C. 154(b) by 0 days.

(21) Appl. No.: 15/164,751

(22) Filed: May 25, 2016

(65) Prior Publication Data

US 2017/0343600 A1    Nov. 30, 2017

(51) Int. Cl.
*G01R 31/28* (2006.01)
*G01R 23/16* (2006.01)

(52) U.S. Cl.
CPC ................ *G01R 31/2822* (2013.01)

(58) Field of Classification Search
CPC ............ G01R 31/2822; G01R 23/16
See application file for complete search history.

(56) References Cited

U.S. PATENT DOCUMENTS

| | | | | |
|---|---|---|---|---|
| 5,812,563 | A * | 9/1998 | Hedlund | G01R 31/2803 714/738 |
| 6,259,264 | B1 * | 7/2001 | Freund | G01R 31/2635 324/750.08 |
| 6,268,738 | B1 * | 7/2001 | Gunthorpe | G01R 31/002 324/501 |
| 6,553,546 | B1 * | 4/2003 | Murakami | G01R 31/311 324/501 |
| 7,355,417 | B1 * | 4/2008 | Shusterman | G01R 29/0871 324/754.21 |
| 2002/0040466 | A1 * | 4/2002 | Khazei | G01R 31/001 716/115 |
| 2015/0241493 | A1 * | 8/2015 | Canne | G01R 29/0814 324/612 |
| 2017/0067961 | A1 * | 3/2017 | O'Flynn | G01R 31/31703 |

* cited by examiner

*Primary Examiner* — Akm Zakaria
(74) *Attorney, Agent, or Firm* — Jensen & Puntigam, P.S.; Clark A. Puntigam

(57) ABSTRACT

The system includes a positioning system for mounting the circuit board to be tested and for mounting a sensor assembly. A control system registers the position of the sensor assembly relative to the circuit board to be tested and for moving the sensor assembly about the circuit board. The sensor assembly detects noise or other emissions generated by the circuit elements on the board. The noise emissions are separate from the operating signals of the circuit. The spectrum analyzer receives the emissions from the sensor assembly and produces frequency spectrum data over a selected frequency range with amplitude information. A processing system then compares the frequency spectrum information with frequency spectrum information from boards known to be good and provides information as to any differences and whether they are in an acceptable tolerance range.

5 Claims, 5 Drawing Sheets

SYSTEM FOR FAULT DETERMINATION FOR ELECTRONIC CIRCUITS

TECHNICAL FIELD

This invention relates generally to the determination of faults in electronic circuits and more specifically concerns a system for making fault determinations for a variety of electronic circuits, including both low and high frequency circuits.

BACKGROUND OF THE INVENTION

It is well recognized that fast and accurate fault determinations in electronic circuits involving component failures or degradation is important. Electronic components and/or circuits or other circuit elements present on circuit boards may fail in the field due to damage or age or they may otherwise degrade sufficiently over time that they may no longer meet the manufacturer's specifications. Failed circuits boards are often tested, instead of being discarded, to determine the source of the failure, which typically would be in one or more components, electrical circuit connections or other elements on the circuit board. Following fault diagnosis, if successful, attempts are typically made to repair the board.

Various testing devices are designed to identify the source of the failed or marginally operative component. These test devices typically include the use of equipment involving either automatic or manual comparison of digital signatures of circuit components while the circuit is operating. One such device is shown and described in U.S. Pat. No. 4,965,516. Such devices include probes which are used to physically contact circuit elements. The test devices using contact probes are typically best suited for circuits operating below 100 MHz. At significantly higher frequencies, i.e. 200 MHz or above, which include most all radio frequency circuits as well as microwave circuits, such devices are typically not effective. In such cases, non contact devices or systems such as shown and described in U.S. Pat. No. 7,496,466, which is owned by the assignee of the present invention, can be successfully used. However, such a system is typically most useful at higher frequencies. In general, it would be desirable for a testing device to be useful with circuit boards which operate with a wide range of frequencies, including both lower (non-RF) and higher (RF and higher) frequency circuit boards.

SUMMARY OF THE INVENTION

Accordingly, a system for fault determinations in electronic circuits, comprises: a positioning system for mounting a circuit board or device having circuit elements thereon to be tested and for mounting a sensor assembly, said positioning system capable of moving the sensor in X, Y and Z dimensions relative to the circuit board; a control system for the positioning system for registering the position of the sensor assembly relative to the circuit board to be tested and for moving the sensor assembly to selected known locations for the circuit board to be tested; a sensor assembly for obtaining noise or other emissions generated by the circuit elements on the board at selected and known locations, the noise/emissions being separate from the operating signals of the circuit; a spectrum analyzer for receiving the emissions from the sensor assembly and producing frequency spectrum information over a selected frequency range with amplitude information at selected frequencies within the range; and a processing system for comparing the frequency spectrum information obtained at selected locations on the circuit board with noise/emissions from a circuit board known to be good and providing information to the user whether or not any differences are within an acceptable range of differences wherein differences not within the acceptable range are an indication of a possible circuit fault.

BEST MODE FOR CARRYING OUT THE INVENTION

The circuit fault diagnostic system disclosed herein is designed to determine the location of faults in electronic assembly circuits and systems, involving a wide range of operating signal frequencies, from a lower end of approximately 1 MHz to above 200 MHz, into the radio frequency and microwave ranges.

The fault diagnostic system disclosed herein relies on the fact that electronic circuits or various parts of the electronic circuits, including components and other elements, produce miscellaneous, high frequency (RF) noise and other emissions unrelated to the actual operating signals (electrical currents and voltages) associated with the operation of the various circuit elements. The present system collects these various emissions by a sensor/antenna, digitizes them in a spectrum analyzer and compares the results with spectrum data from circuits known to be good, a process known generally as signature analysis.

Generally, the magnitude and the frequency distribution of these high frequency emissions, including what is generally referred to as noise, will vary significantly. In the present system, such detected emissions/noise are not compared against a threshold or standard for purposes of evaluating actual suitable performance but rather are compared with spectrum data from circuit boards known to be good to determine possible fault locations, since such emissions/noise will change as the circuit operation changes. The present invention is thus not directly concerned with the level of the emission/noise exceeding a particular manufacturer's standard (boards which are too "noisy" are rejected) but rather whether the actual emissions/noise levels are similar to those from a board known to be good. Thus, circuit boards which may satisfy a noise level standard may also produce high frequency emissions or lack of emissions which indicate a fault. In general, the noise/emissions are obtained from a circuit device under test (referred to generally as a DUT), without any physical contact by a probe, at a plurality (or just one in a special case) of locations on the circuit board. Testing can be done in a specific location sequence, or with a more global approach, during which the board is tested over a range of board locations. The test results are then compared in batch form with results from similar locations on a known good board.

The signals from the antenna sensor are then digitized in a spectrum analyzer to form a digital spectral signature for each selected location on the board. The differences between the digital signature at each location and a signature from the same location on a board known to be good are determined and the differences are evaluated against pre-established tolerances. The differences could include more emissions or greater magnitudes or fewer emissions or lesser magnitudes. The results of the processing can then be displayed in various forms.

Figure 1:
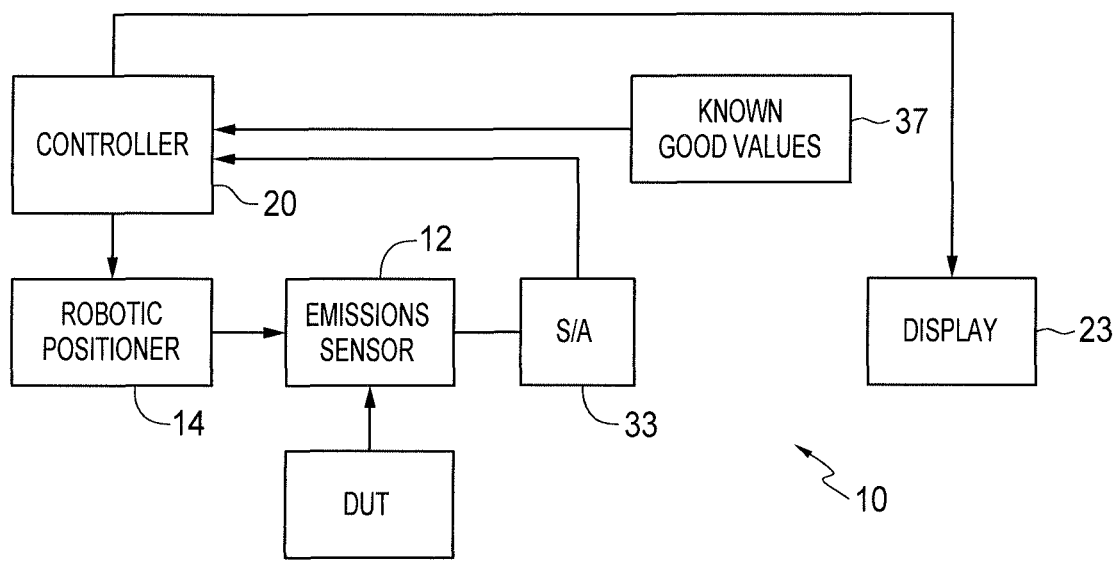
FIG. 1 is a block diagram of the overall system disclosed herein.
Figure 2:
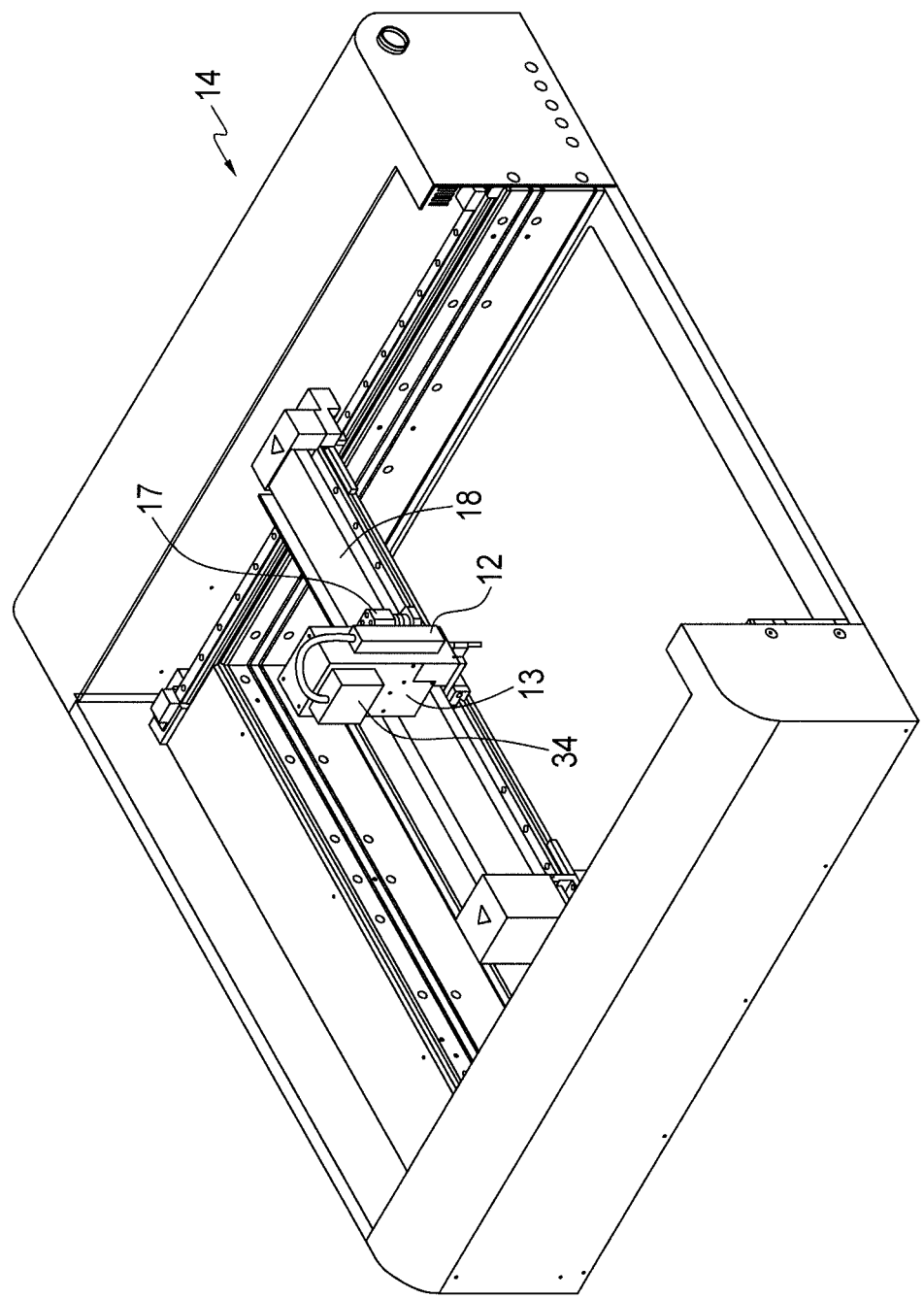
FIG. 2 is a perspective view of a portion of the system of FIG. 1.
Figure 5:
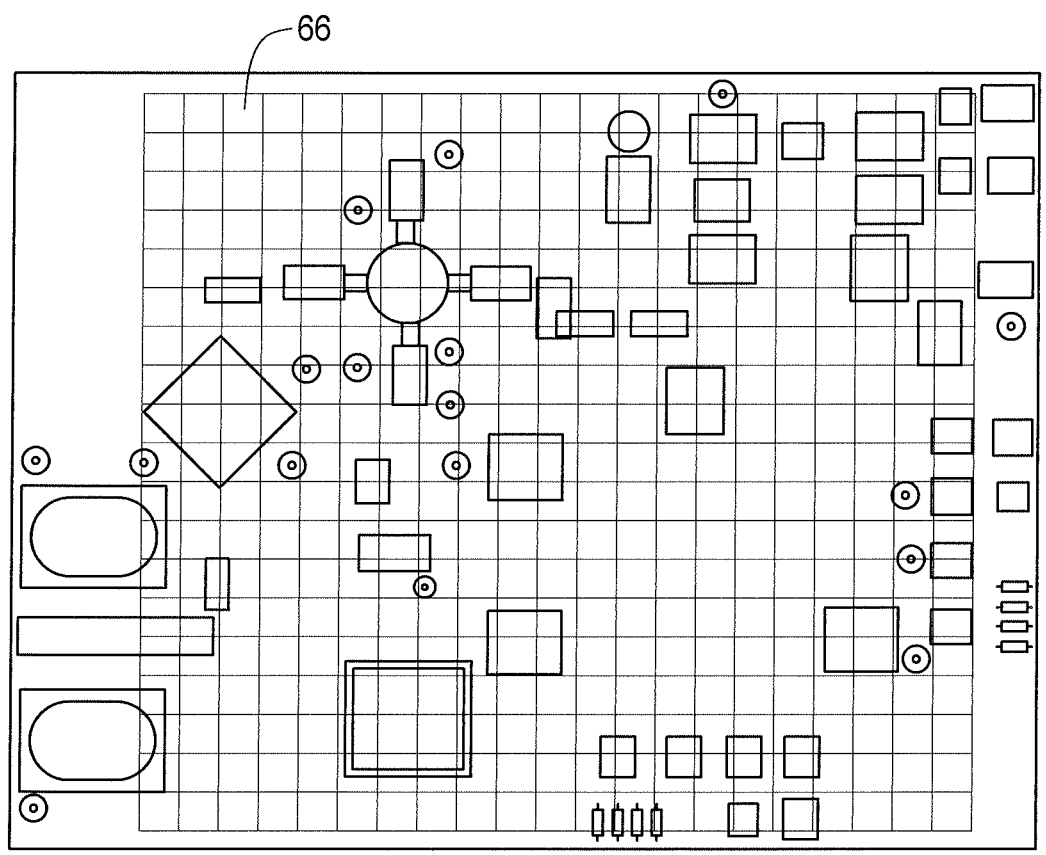
FIG. 5 is grid overlay on a representative electronic circuit illustrating the test coverage of the present system.

Referring now specifically to FIG. 1, the system is shown in block form generally at 10, including an emissions sensor 12, which is explained in more detail below. The sensor 12 is located in a robotic positioning device 14 which is capable of moving the sensor from location to location relative to the circuit or device under test. A circuit board to be tested is mounted in the robotic positioner 14. An example of such a circuit board is shown in FIG. 5. This circuit indicates a variety of individual circuit elements or components, but it should be understood that it is an example only, for illustration. FIG. 2 shows one embodiment of robotic positioner 14 which is disclosed in more detail in U.S. Pat. No. 7,091,730, in general, and which is incorporated herein by reference. Robotic positioner 14 has a mounting assembly 13 to which sensor 12 is located. Positioner 14 has a mounting assembly 13 to which the sensor 12 is secured as well as a camera 17 and which is capable of moving the mounting assembly with the sensor 12 in X, Y and Z axis dimensions.

In particular, positioner 14 is capable of locating sensor 12 at selected X, Y points on the printed circuit card and then moving the sensor in the Z direction to provide a desired vertical separation between the circuit elements being tested and the sensor. FIG. 5 shows a circuit overlaid by a grid, which shows an example of how the positioner can be moved and take various sensor measurements. The mounting assembly is positioned on a carriage 18, with the carriage being moveable in the X direction relative to the circuit board. The mounting assembly further more is capable of moving along carriage 18 in the Y direction. All X, Y positions within the field of coverage of the positioner are thus accessible. The positioning device is moved in the X, Y and Z directions automatically by software control present in a controller/processor 20 to selected points relative to the circuit board to be tested. The controller 20 is capable of registering, i.e. orienting, the sensor 12 relative to the circuit board at the start of the process to ensure accurate comparison between the measured emissions from the circuit and the emission values from a board known to be good (known good values). For instance, X, Y data point 0,0 for the sensor can be registered to correspond to the left lower corner of the device under test. This can be a reference (home position) for the sensor 12 relative to the circuit board being tested, providing a basis for the controller for locating all subsequent positions on the board and for comparing the corresponding known good values. The mounting assembly is moved by stepper motors or other similar devices relative to X, Y and Z coordinates for the selected locations around the board. The robotic positioner is not described in further structural detail, since such devices are known and available commercially, such as one from Huntron, Inc. and are further described generally in the '730 patent. The sensor 12 (FIG. 1) detects RF (high frequency) emissions generated by the circuit under test. These emissions are produced by the components etc. on the board, separate from the operating signals.

Figure 3:
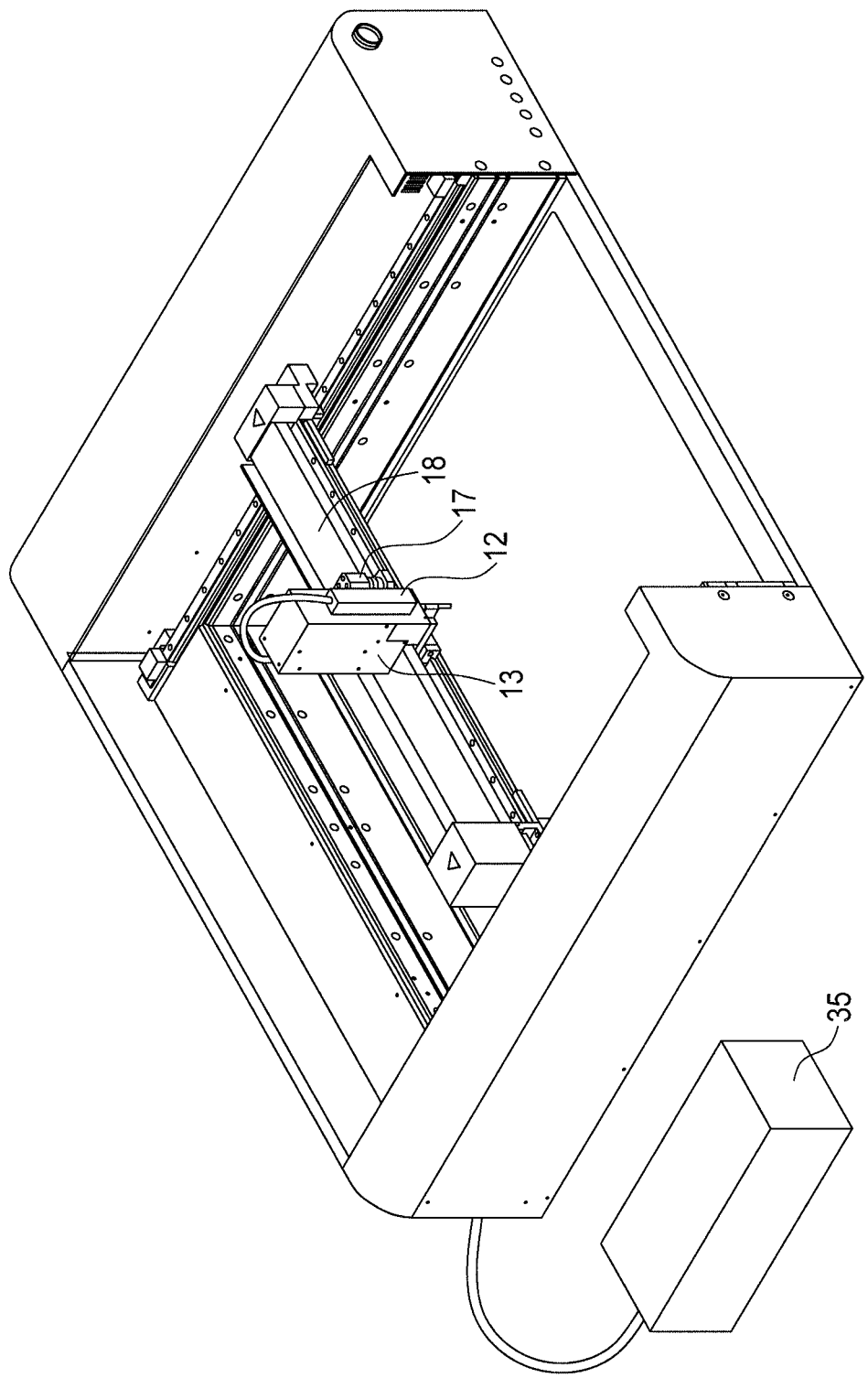
FIG. 3 is a perspective view of an alternative embodiment to that of FIG. 2.
Figure 6:
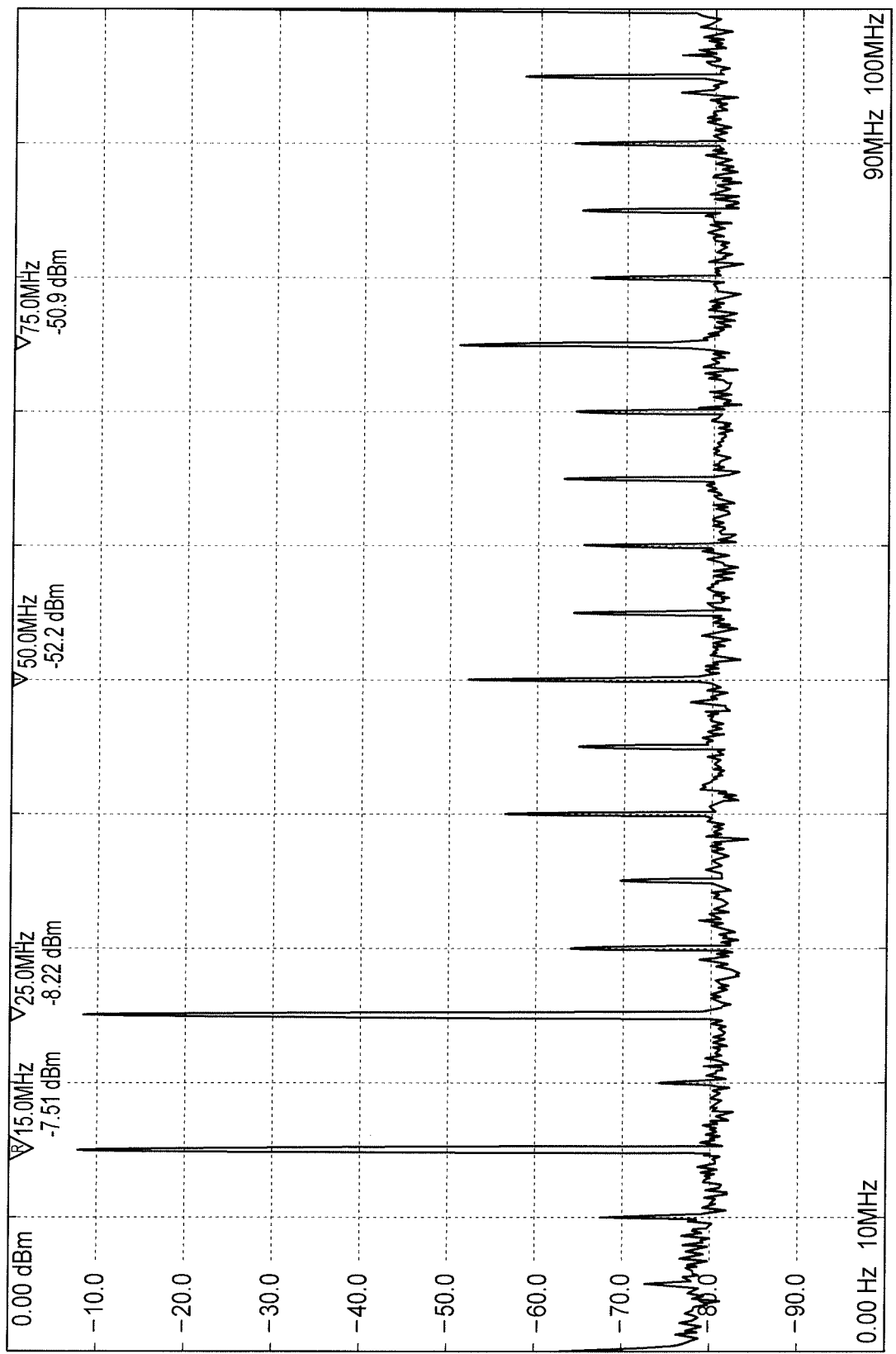
FIG. 6 is a representative frequency spectrum diagram used in the operation of the system of FIG. 1.

Circuit emissions, or signals, are detected by the antenna 12. These signals span a wide range of frequencies, such as for example between 1 MHz and 200 MHz, although the range could be wider. The emissions are applied to a spectrum analyzer 33 (FIG. 1) which produces a digitized output across a spectrum of frequencies, with individual selected frequencies having an emissions amplitude. FIG. 2 shows an arrangement where the spectrum analyzer 34 is attached to the mounting structure while FIG. 3 shows an alternate arrangement where the spectrum analyzer 35 is positioned outside of the positioner. As an example there may be 50 or substantially more frequencies selected within a broad frequency range. Each frequency will have an amplitude associated therewith as part of the spectrum data signals provided by the sensor. The output of the spectrum analyzer is in digital form for comparison with known good values. The output from the spectrum analyzer could be a digitized version of the raw or partially processed data, comprising a plurality of individual frequency points along a frequency spectrum, with each frequency having a particular amplitude corresponding to signal strength at the selected frequency. This digitized data is sent to a controller/processor 20 which compares the spectrum data from the spectrum analyzer to the spectrum data from boards known to be good. The results of the comparison are provided to a display device 23. The comparison can be done on a location by location basis, sequentially, or data can be taken from all the selected locations on the entire board and comparisons made in a batch manner thereafter. The known good values 37 have been previously determined/obtained and are stored for use in the present system. Typically, several known good boards are used to determine the comparison data. FIG. 6 illustrates digital data from the spectrum analyzer. In this example, the frequency range covers 10 MHz to 100 MHz, and shows amplitudes at selected frequencies. Again, the individual frequencies can be selected by the designer.

Figure 4:
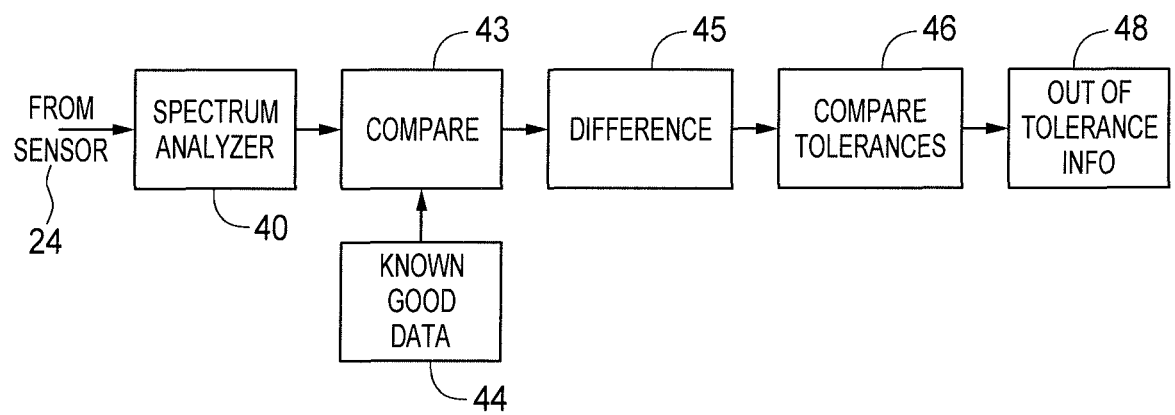
FIG. 4 is a flow chart of the processing steps carried out by the system of FIG. 1.

FIG. 4 shows the sequence of operations of the present system. Signals from the sensor, i.e. antenna 24, are applied to the spectrum analyzer shown at block 40. The data from the spectrum analyzer such as shown in FIG. 6 is then compared at 43 with spectrum data 44 from boards which are known to be good. The result of the comparison is a difference between each frequency in the two frequency spectrum data (actual and known to be good). The difference values in the frequency spectrum data is compared against predetermined tolerances at 46 and the result is displayed 48, including out-of-tolerance information. This information can take various forms, including graphic, tabular bar graph other read outs.

It should be noted that the results from the spectrum analyzer are not used to determine the suitability of a circuit board relative to the magnitude of high frequency emissions/noise but rather are used in comparison with emission signals from a board which is known to be good, operationally, for the purposes of determining a possible fault location, i.e. the emissions are used simply to determine possible faults on the board as opposed to rejecting or accepting a particular board based on the magnitude of the emissions satisfying a preselected standard relative to emissions/noise levels.

In detailed operation, a circuit board or other electronic device to be tested is positioned within the robotic positioner 14. The sensor mounted on the positioner is then moved through a plurality of positions, determined by the controller 20. The sequence of positions could cover a selected area on the circuit board, such as shown in FIG. 5. As one example, one test area on a board could cover two cm by two cm, in one mm successive increments, producing a grid of spectrum data. The grid can vary depending on the individual application. The test areas could be larger or smaller and the individual test areas could be closer together or farther apart. In FIG. 5, there is an overlay of selected circuit portions 66 of 2 cm, covering a total of 400 separate measurements to cover the circuit area.

In one embodiment, the emissions from each possible position in the grid is measured while in another embodiment, only selected locations are measured, dependent upon the individual circuit to be tested and/or the likelihood of failure of particular components. The selection will depend upon the particular application. Further, the settings of the spectrum analyzer can vary, depending upon the particular application, covering a selected range of frequencies. Further, the results of the comparison can be provided to the user in various ways, including graphical, visual or tabular, among other possibilities. The tabular format for instance could include a bar graph or similar display whether or not the differences between the measured and the good values are within a selected tolerance. In a further format the display may simply determine whether a fault possibility has been made identified at the selected locations.

The test procedures are carried out with the circuit and the test device operating with normal power input in which the circuit board or device being tested is in a typical operating mode, or alternatively, a specific electrical signal stimulus may be applied to the circuit during performance of the test.

The results of the test using high frequency emissions can then be used to determine a possible failure or locations by investigating the actual operation of the circuit components or elements using conventional fault determination techniques.

The function of and structure of and purpose of the present invention is to make use of high frequency emissions/noise of the individual parts or elements of a circuit against emissions/noise of similar circuits known to be good. These emissions/noise are separate and apart from the normal operating currents and voltages and their corresponding signals of the circuit itself.

The present system determines possible faults in electronic circuits making use of high frequency noise/emissions from the individual circuit parts or elements. The detected emissions are then compared to emissions/noise from circuits which are known to be good. Differences greater than pre-established tolerances provide an indication of a possible circuit fault which can then be determined by conventional test methods/devices.

Although a preferred embodiment of the invention has been disclosed here for purposed of illustration, it should be understood that various changes, modifications and substitutions may be incorporated in the embodiment without departing from the spirit of the invention which is defined by the claims which follow:

What is claimed is:

1. A system for testing electronic circuits, comprising:
   a positioning system for mounting a circuit board or device previously operating properly but no longer operating properly, the circuit board or device having circuit elements thereon to be tested, the positioning system also mounting a sensor assembly, said positioning system capable of moving the sensor assembly in X, Y and Z dimensions relative to the circuit board or device;
   a control system for the positioning system for registering a position of the sensor assembly relative to the circuit board or device to be tested and for moving the sensor assembly to selected known locations for the circuit board or device to be tested;
   a sensor assembly for obtaining noise emissions generated by the circuit elements on the circuit board or device being tested at the selected known locations, the noise emissions being produced by the circuit board or device while the circuit board or device is in circuit under normal operating circuit conditions, the noise emissions being unrelated to operating signals of the circuit board or device;
   a spectrum analyzer for receiving the noise emissions from the sensor assembly and producing frequency spectrum information present at the selected known locations over a selected frequency range with amplitude information at selected frequencies within the selected frequency range, wherein the system includes frequency spectrum information from a separate circuit board or device known to be good relative to the circuit board or device being tested; and
   a processing system for comparing the frequency spectrum information obtained at the selected known locations on the circuit board or device being tested with a separate frequency spectrum information from the separate circuit board or device known to be good, generating a difference therebetween, and providing information to a user whether or not the difference is within an acceptable range of difference, wherein the difference not within the acceptable range of difference is an indication of the circuit board or device having a fault preventing proper operation of the circuit board or device.

2. The system of claim 1, wherein the sensor assembly includes an antenna.

3. The system of claim 2, wherein the positioning system includes a mounting element and the antenna and the spectrum analyzer are mounted on the mounting element.

4. The system of claim 1, wherein the spectrum analyzer is positioned away from the positioning system.

5. The system of claim 1, wherein the frequency range of the noise emissions is 1 MHz-200 MHz.

* * * * *